US012701708B2

(12) United States Patent
Lee et al.

(10) Patent No.: US 12,701,708 B2
(45) Date of Patent: *Aug. 4, 2026

(54) SEMICONDUCTOR MEMORY DEVICES HAVING STACKED STRUCTURES THEREIN THAT SUPPORT HIGH INTEGRATION

(71) Applicant: Samsung Electronics Co., Ltd., Suwon-si (KR)

(72) Inventors: Sangjae Lee, Busan (KR); Jaehyung Kim, Seoul (KR); Dongseog Eun, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 265 days.

This patent is subject to a terminal disclaimer.

(21) Appl. No.: 18/333,886

(22) Filed: Jun. 13, 2023

(65) Prior Publication Data

US 2023/0328990 A1 Oct. 12, 2023

Related U.S. Application Data

(63) Continuation of application No. 16/985,024, filed on Aug. 4, 2020, now Pat. No. 11,716,844.

(30) Foreign Application Priority Data

Feb. 4, 2020 (KR) ........................ 10-2020-0013087

(51) Int. Cl.
*H10B 43/27* (2023.01)
*H10B 43/35* (2023.01)
*H10B 43/40* (2023.01)

(52) U.S. Cl.
CPC ............. *H10B 43/27* (2023.02); *H10B 43/35* (2023.02); *H10B 43/40* (2023.02)

(58) Field of Classification Search
CPC ........ H10B 53/00; H10B 53/10; H10B 53/20; H10B 53/30; H10B 53/40; H10B 53/50;
(Continued)

(56) References Cited

U.S. PATENT DOCUMENTS 7,885,114 B2 2/2011 Park et al.
8,213,231 B2 7/2012 Park et al.
(Continued)

FOREIGN PATENT DOCUMENTS

KR 101192359 B1 10/2012
KR 20160003977 A 1/2016
KR 20190138513 A 12/2019

OTHER PUBLICATIONS

Parat et al. "A Floating Gate Based 3D NAND Technology With CMOS Under Array" 2015 IEEE International Electron Devices Meeting (Dec. 2015).

*Primary Examiner* — William B Partridge
*Assistant Examiner* — Gustavo G Ramallo
(74) *Attorney, Agent, or Firm* — Wolf, Greenfield & Sacks, P.C.

(57) ABSTRACT

A semiconductor device includes an upper stack structure extending on a lower stack structure, which extends on an underlying substrate. A channel structure extends through the upper stack structure and the lower stack structure. The lower stack structure includes a first lower electrode layer disposed adjacent to an interface between the lower stack structure and the upper stack structure, and a second lower electrode layer disposed adjacent a center of the lower stack structure. The upper stack structure includes a first upper electrode layer disposed adjacent to the interface, and a second upper electrode layer disposed adjacent a center of the upper stack structure. At least one of the first lower electrode layer and the first upper electrode layer is thicker than the second lower electrode layer. At least one insulating (Continued)

layer is disposed between the first lower electrode layer and the first upper electrode layer.

20 Claims, 13 Drawing Sheets

(58) Field of Classification Search
CPC ........ H10B 41/00; H10B 41/10; H10B 41/20;
H10B 41/23; H10B 41/27; H10B 41/30;
H10B 41/35; H10B 41/40–44; H10B
41/46–50; H10B 41/60; H10B 41/70;
H10B 43/00; H10B 43/10; H10B 43/20;
H10B 43/23; H10B 43/27; H10B 43/30;
H10B 43/35; H10B 43/40; H10B 43/50;
H10B 51/00; H10B 51/10; H10B 51/20;
H10B 51/30; H10B 51/40; H10B 51/50
See application file for complete search history.

(56) References Cited

U.S. PATENT DOCUMENTS

| | | | |
|---|---|---|---|
| 8,339,859 | B2 | 12/2012 | Park et al. |
| 8,673,782 | B2 | 3/2014 | Park et al. |
| 8,901,745 | B2 | 12/2014 | Hwang et al. |
| 8,901,746 | B2 | 12/2014 | Park et al. |
| 8,902,660 | B2 | 12/2014 | Park et al. |
| 9,000,508 | B2 | 4/2015 | Lee et al. |
| 9,570,463 | B1 | 2/2017 | Zhang et al. |
| 9,673,291 | B2 | 6/2017 | Fukuzumi |
| 9,876,031 | B1 | 1/2018 | Shimizu et al. |
| 9,922,990 | B2 | 3/2018 | Song |
| 9,960,181 | B1 | 5/2018 | Cui et al. |
| 10,748,925 | B1 | 8/2020 | Tsutsumi et al. |
| 11,716,844 | B2* | 8/2023 | Lee ........................ H10B 43/35 |
| | | | 257/326 |
| 2011/0204420 | A1 | 8/2011 | Kim et al. |
| 2014/0001530 | A1* | 1/2014 | Song ..................... H10D 30/60 |
| | | | 257/314 |
| 2015/0255481 | A1 | 9/2015 | Baenninger et al. |
| 2015/0255781 | A1 | 9/2015 | Hashimoto |
| 2016/0005760 | A1 | 1/2016 | Lee et al. |
| 2017/0110473 | A1 | 4/2017 | Lee |
| 2017/0271347 | A1 | 9/2017 | Fukuzumi |
| 2017/0317096 | A1 | 11/2017 | Shin et al. |
| 2018/0358371 | A1 | 12/2018 | Hwang et al. |
| 2019/0067246 | A1 | 2/2019 | Wu et al. |
| 2019/0287997 | A1 | 9/2019 | Komiya et al. |
| 2019/0304992 | A1* | 10/2019 | Baek ..................... H10B 41/42 |
| 2019/0312055 | A1 | 10/2019 | Baek et al. |
| 2019/0371809 | A1 | 12/2019 | Yun et al. |

* cited by examiner

FIG. 7
FIG. 8
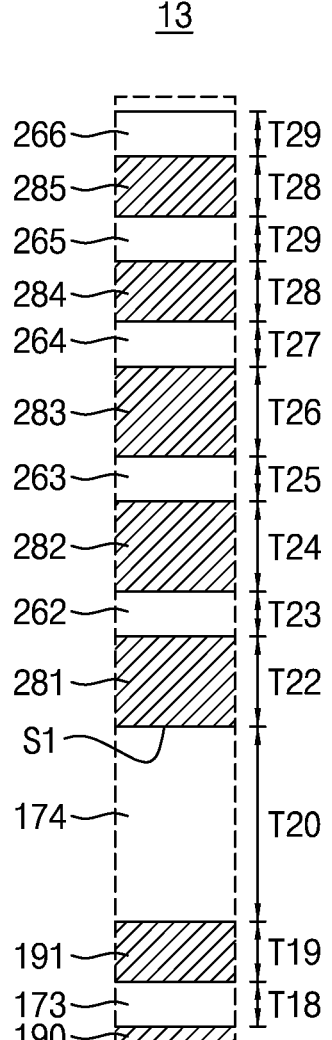
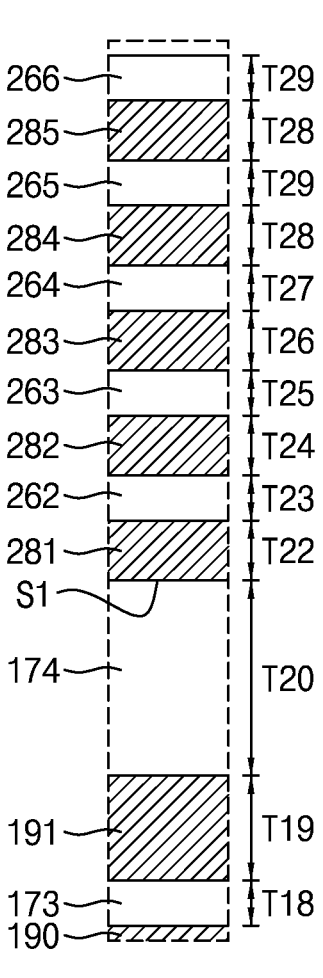

<u>15</u>

<u>16</u>

<u>17</u>

SEMICONDUCTOR MEMORY DEVICES HAVING STACKED STRUCTURES THEREIN THAT SUPPORT HIGH INTEGRATION

REFERENCE TO PRIORITY APPLICATION

This application is a continuation of and claims priority from U.S. patent application Ser. No. 16/985,024, filed Aug. 4, 2020, which claims priority from Korean Patent Application No. 10-2020-0013087, filed Feb. 4, 2020, the disclosures of which are hereby incorporated herein by reference.

BACKGROUND

1. Field

Exemplary embodiments of the disclosure relate to semiconductor memory devices that utilize stacked structures and methods of forming the same.

2. Description of the Related Art

In accordance with high integration of semiconductor devices, development of a technology for sequentially stacking a plurality of stack structures on a substrate is being conducted. Formation of an upper stack structure on a lower stack structure and formation of a plurality of channel structures extending vertically through the upper stack structure and the lower stack structure may be confronted with various technical challenges and limitations. For example, devices disposed adjacent to an interface between the lower stack structure and the upper stack structure may exhibit various variations of electrical characteristics.

SUMMARY

The exemplary embodiments of the disclosure provide semiconductor devices capable of supporting reliable electrical characteristics of devices disposed adjacent to an interface between a lower stack structure and an upper stack structure and methods for forming the same.

A semiconductor device according to an embodiment of the disclosure includes a lower stack structure including a plurality of lower insulating layers and a plurality of lower electrode layers which are stacked in an alternating sequence of electrode and insulating layers. An upper stack structure disposed on the lower stack structure is provided. The upper stack structure includes a plurality of upper insulating layers and a plurality of upper electrode layers which are stacked in an alternating sequence of electrode and insulating layers. A channel structure is provided, which extends in the upper stack structure and the lower stack structure. The plurality of lower electrode layers includes a first lower electrode layer and a second lower electrode layer. The plurality of upper electrode layers includes a first upper electrode layer and a second upper electrode layer. At least one of the first lower electrode layer and the first upper electrode layer is thicker than the second lower electrode layer. At least one of the plurality of lower insulating layers and the plurality of upper insulating layers is disposed between the first lower electrode layer and the first upper electrode layer. Among the plurality of lower electrode layers, the first lower electrode layer is disposed nearest to an interface between the lower stack structure and the upper stack structure. The second lower electrode layer is disposed adjacent to a center of the lower stack structure. Among the plurality of upper electrode layers, the first upper electrode layer is disposed nearest to the interface. The second upper electrode layer is disposed adjacent to a center of the upper stack structure.

A semiconductor device according to an embodiment of the disclosure includes a horizontal conductive layer disposed on a substrate. A lower stack structure disposed on the horizontal conductive layer is provided. The lower stack structure includes a plurality of lower insulating layers and a plurality of lower electrode layers which are stacked in an alternating sequence of electrode and insulating layers. An upper stack structure disposed on the lower stack structure is provided. The upper stack structure includes a plurality of upper insulating layers and a plurality of upper electrode layers which are stacked in an alternating sequence of electrode and insulating layers. A channel structure is provided, which extends to an inside of the horizontal conductive layer while extending through the upper stack structure and the lower stack structure. A bit line is provided, which is disposed on the upper stack structure, and is electrically connected to the channel structure. A first lower electrode layer disposed nearest to an interface between the lower stack structure and the upper stack structure among the plurality of lower electrode layers is thicker than a second lower electrode layer disposed adjacent to a center of the lower stack structure among the plurality of lower electrode layers. At least one of the plurality of lower insulating layers and the plurality of upper insulating layers directly contacts the interface.

A semiconductor device according to an embodiment of the disclosure includes a horizontal conductive layer disposed on a substrate. A lower stack structure disposed on the horizontal conductive layer is provided. The lower stack structure includes a plurality of lower insulating layers and a plurality of lower electrode layers which are stacked in an alternating sequence of electrode and insulating layers. An upper stack structure disposed on the lower stack structure is provided. The upper stack structure includes a plurality of upper insulating layers and a plurality of upper electrode layers which are stacked in an alternating sequence of electrode and insulating layers. A channel structure is provided, which extends to an inside of the horizontal conductive layer and extends through the upper stack structure and the lower stack structure. A bit line is provided, which is disposed on the upper stack structure and is electrically connected to the channel structure. A first upper electrode layer, which is disposed nearest to an interface between the lower stack structure and the upper stack structure among the plurality of upper electrode layers, is thicker than a second upper electrode layer disposed adjacent to a center of the upper stack structure. At least one of the plurality of lower insulating layers and the plurality of upper insulating layers directly contacts the interface.

BRIEF DESCRIPTION OF THE DRAWINGS

FIGS. 2 to 11 are enlarged views showing a portion of FIG. 1.

DETAILED DESCRIPTION OF EXEMPLARY EMBODIMENTS

Figure 1:
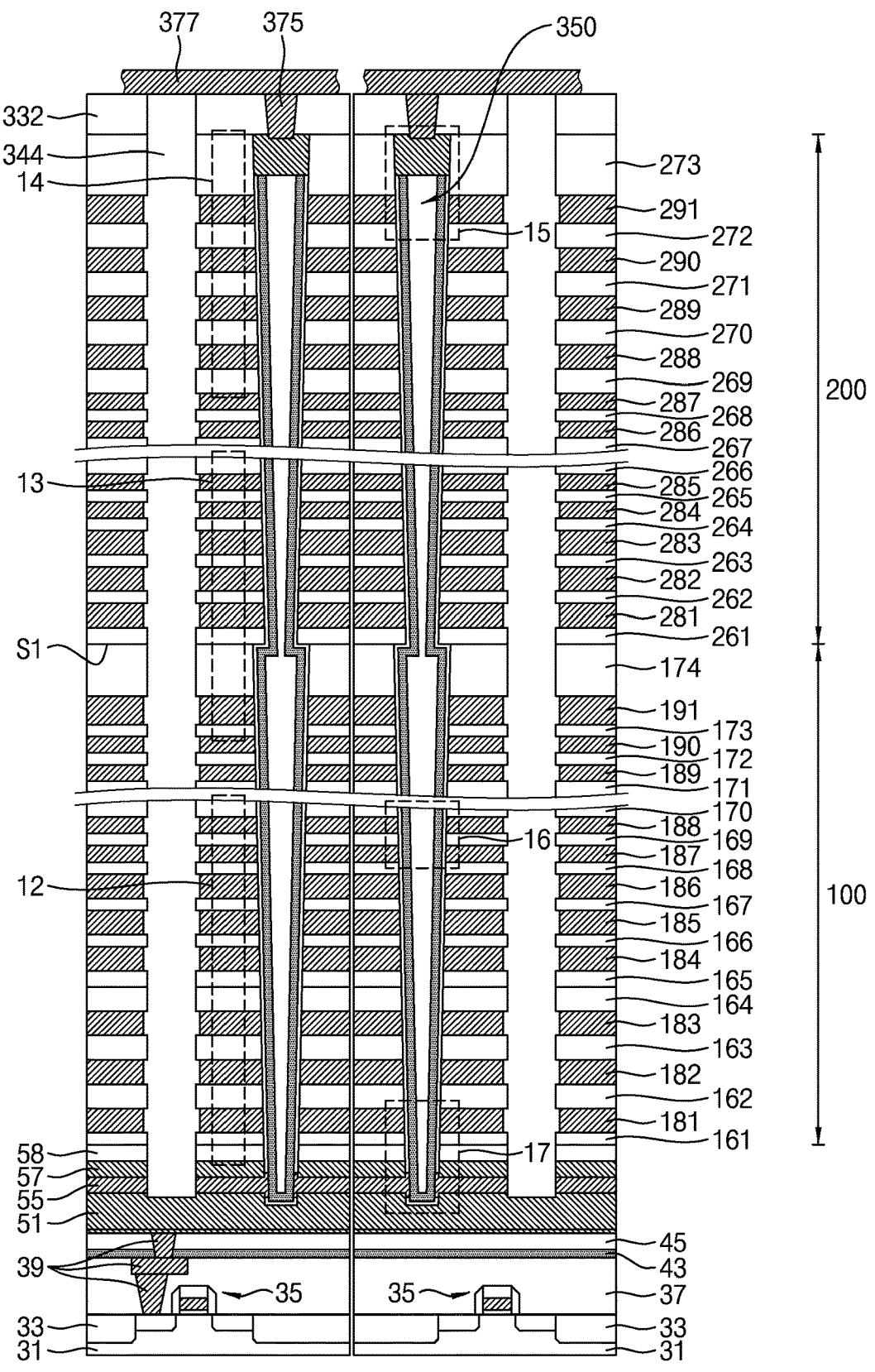
FIGS. 1 and 12 are sectional views that illustrate semiconductor devices according to exemplary embodiments of the disclosure.
Figures 2, 3, 4:
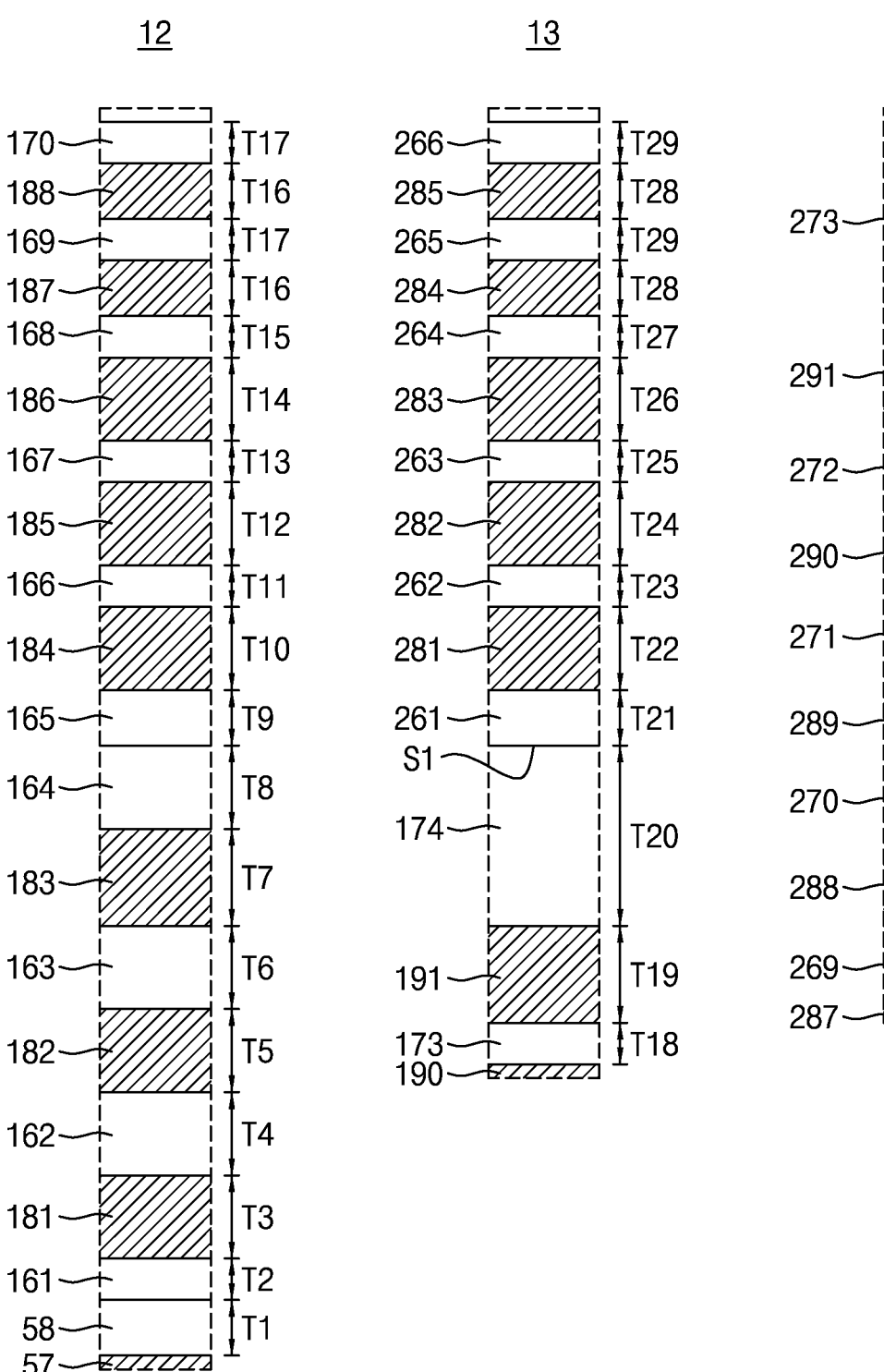
Figure 9:
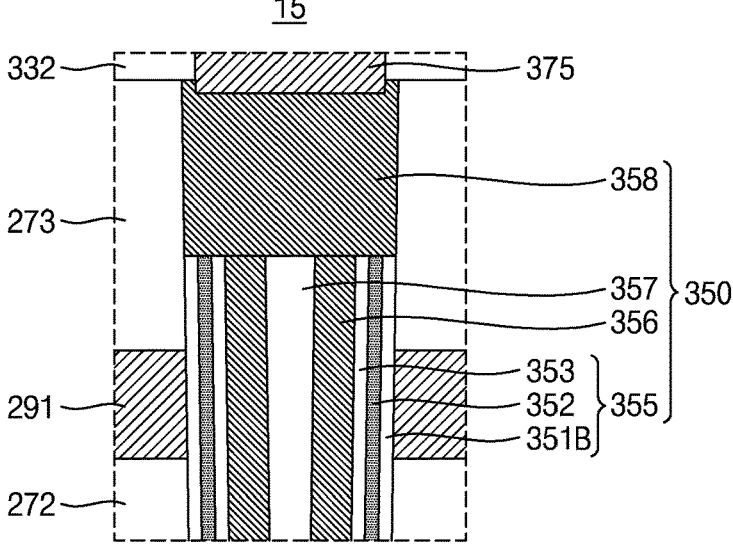
Figure 10:
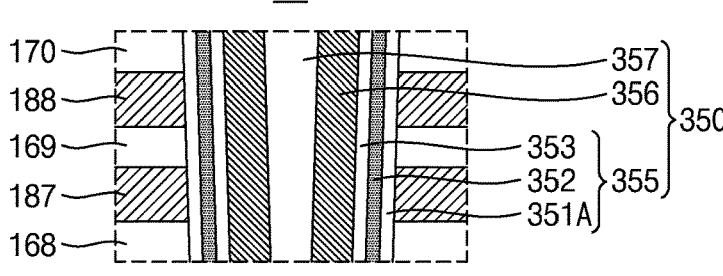
Figure 11:
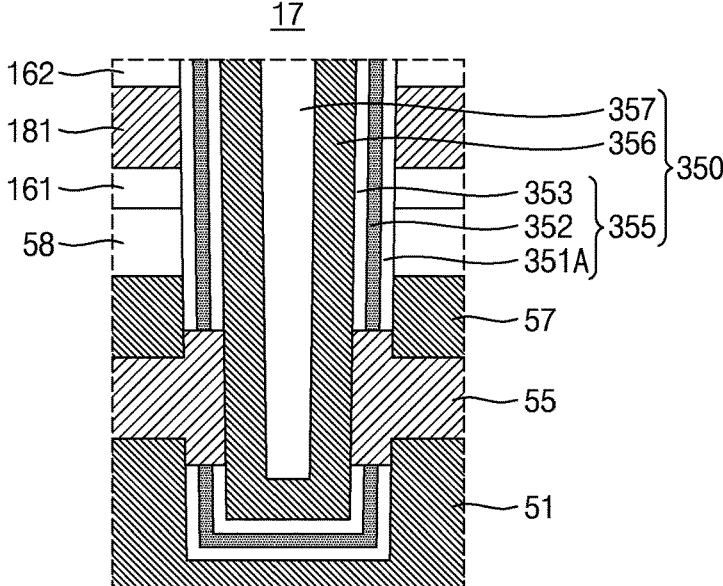

FIG. 1 is a sectional view explaining semiconductor devices according to exemplary embodiments of the disclosure. FIG. 2 is an enlarged view showing a portion 12 of FIG. 1. FIG. 3 is an enlarged view showing a portion 13 of FIG. 1. FIG. 4 is an enlarged view showing a portion 14 of FIG. 1. FIGS. 5 to 8 are enlarged views showing the portion 13 of FIG. 1. FIG. 9 is an enlarged view showing a portion 15 of FIG. 1. FIG. 10 is an enlarged view showing a portion 16 of FIG. 1. FIG. 11 is an enlarged view showing a portion 17 of FIG. 1. The semiconductor devices according to the exemplary embodiments of the disclosure may include non-volatile memories such as VNAND or other 3D flash memory. The semiconductor devices according to the exemplary embodiments of the disclosure may be interpreted as including cell-on-peripheral (COP) structures.

Referring to FIG. 1, each of the semiconductor devices according to the exemplary embodiments of the disclosure may include a substrate 31, an element isolation layer 33, a plurality of transistors 35, a first interlayer insulating layer 37, a plurality of peripheral circuit wirings 39, a capping layer 43, a second interlayer insulating layer 45, a horizontal conductive layer 51, a connecting conductive layer 55, a support 57, a third interlayer insulating layer 58, a lower stack structure 100, an upper stack structure 200, a plurality of channel structures 350, a fourth interlayer insulating layer 322, a plurality of isolation patterns 344, a plurality of bit plugs 375, and a plurality of bit lines 377.

The lower stack structure 100 may include a plurality of lower insulating layers 161 to 174 and a plurality of lower electrode layers 181 to 191 which are alternately repeatedly stacked. The upper stack structure 200 may include a plurality of upper insulating layers 261 to 273 and a plurality of upper electrode layers 281 to 291 which are alternately repeatedly stacked. In an exemplary embodiment, each of the plurality of channel structures 350 may include a step disposed adjacent to an interface 51 between the lower stack structure 100 and the upper stack structure 200. Each side wall of the plurality of channel structures 350 may have a stepped profile in an area adjacent to the interface 51.

In an exemplary embodiment, the horizontal conductive layer 51 may correspond to a source line or a common source line (CSL). The first lower electrode layer 181 and the second lower electrode layer 182 may correspond to gate-induced drain leakage (GIDL) control lines, respectively. The third lower electrode layer 183 may correspond to a ground selection line (GSL). The fourth lower electrode layer 184 and the fifth lower electrode layer 185 may correspond to dummy word lines, respectively. The sixth to tenth lower electrode layers 186 to 190 may correspond to word lines, respectively. The eleventh lower electrode layer 191 may be a dummy word line.

The first upper electrode layer 281 may correspond to a dummy word line. The second to fifth upper electrode layers 282 to 285 may correspond to word lines, respectively. The sixth and seventh upper electrode layers 286 and 287 may correspond to dummy word lines, respectively. The eighth and ninth upper electrode layers 288 and 289 may correspond to string selection lines (SSLs), respectively. The tenth and eleventh upper electrode layers 290 and 291 may correspond to gate-induced drain leakage (GIDL) control lines, respectively.

Referring to FIG. 2, the third interlayer insulating layer 58 may have a first thickness T1. The first lower insulating layer 161 may have a second thickness T2. The first lower electrode layer 181 may have a third thickness T3. The second lower insulating layer 162 may have a 4-th thickness T4. The second lower electrode layer 182 may have a 5-th thickness T5. The third lower insulating layer 163 may have a 6-th thickness T6. The third lower electrode layer 183 may have a 7-th thickness T7. The fourth lower insulating layer 164 may have an 8-th thickness T8. The fifth lower insulating layer 165 may have a 9-th thickness T9. The fourth lower electrode layer 184 may have a 10-th thickness T10. The sixth lower insulating layer 166 may have an 11-th thickness T11. The fifth lower electrode layer 185 may have a 12-th thickness T12. The seventh lower insulating layer 167 may have a 13-th thickness T13. The sixth lower electrode layer 186 may have a 14-th thickness T14. The eighth lower insulating layer 168 may have a 15-th thickness T15. The seventh lower electrode layer 187 may have a 16-th thickness T16. The ninth lower insulating layer 169 may have a 17-th thickness T17. The eighth lower electrode layer 188 may have the 16-th thickness T16. The tenth lower insulating layer 170 may have the 17-th thickness T17.

Referring to FIG. 3, the thirteenth lower insulating layer 173 may have an 18-th thickness T18. The eleventh lower electrode layer 191 may have a 19-th thickness T19. The fourteenth lower insulating layer 174 may have a 20-th thickness T20. The first upper insulating layer 261 may have a 21-st thickness T21. The first upper electrode layer 281 may have a 22-nd thickness T22. The second upper insulating layer 262 may have a 23-rd thickness T23. The second upper electrode layer 282 may have a 24-th thickness T24. The third upper insulating layer 263 may have a 25-th thickness T25. The third upper electrode layer 283 may have a 26-th thickness T26. The fourth upper insulating layer 264 may have a 27-th thickness T27. The fourth upper electrode layer 284 may have a 28-th thickness T28. The fifth upper insulating layer 265 may have a 29-th thickness T29. The fifth upper electrode layer 285 may have the 28-th thickness T28. The sixth upper insulating layer 266 may have the 29-th thickness T29.

Referring to FIG. 4, the ninth upper insulating layer 269 may have a 30-th thickness T30. The eighth upper electrode layer 288 may have a 31-st thickness T31. The tenth upper insulating layer 270 may have a 32-nd thickness T32. The ninth upper electrode layer 289 may have a 33-rd thickness T33. The eleventh upper insulating layer 271 may have a 34-th thickness T34. The tenth upper electrode layer 290 may have a 35-th thickness T35. The twelfth upper insulating layer 272 may have a 36-th thickness T36. The eleventh upper electrode layer 291 may have a 37-th thickness T37. The thirteenth upper insulating layer 273 may have a 38-th thickness T38.

Again referring to FIGS. 1 to 4, the horizontal conductive layer 51 may be disposed on the substrate 31. The plurality of transistors 35 may be disposed between the substrate 31 and the horizontal conductive layer 51. The support 57 may be disposed on the horizontal conductive layer 51. The connecting conductive layer 55 may be disposed between the horizontal conductive layer 51 and the support 57. The third interlayer insulating layer 58 may be disposed on the support 57. The lower stack structure 200 may be disposed on the third interlayer insulating layer 58. The upper stack structure 200 may be disposed on the lower stack structure 100. Each of the plurality of channel structures 350 may extend through the upper stack structure 200, the lower stack structure 100, the third interlayer insulating layer 58, the support 57, and the horizontal conductive layer 51. The fourth interlayer insulating layer 332 may be disposed on the upper stack structure 200. The plurality of bit plugs 375 may be disposed in the fourth interlayer insulating layer 332. Each of the plurality of bit plugs 375 may be connected to a corresponding one of the plurality of channel structures 350 while extending through the fourth interlayer insulating layer 332. The plurality of bit lines 377 respectively contacting the plurality of bit plugs 375 may be disposed on the fourth interlayer insulating layer 332. Each of the plurality of bit lines 377 may be electrically connected to a corresponding one of the plurality of channel structures 350 via a corresponding one of the plurality of bit plugs 375.

In an exemplary embodiment, the horizontal conductive layer 51 may be disposed between the substrate 31 and the lower stack structure 100. The support 57 may be disposed between the horizontal conductive layer 51 and the lower stack structure 100. The connecting conductive layer 55 may directly contact the horizontal conductive layer 51. Each of the plurality of channel structures 350 may extend to an inside of the horizontal conductive layer 51 while extending vertically through the upper stack structure 200, the lower stack structure 100, the third interlayer insulating layer 58, and the support 57.

A plurality of other lower electrode layers may be disposed between the eighth lower electrode layer 188 and the ninth lower electrode layer 189. One of the seventh lower electrode layer 187, the eighth lower electrode layer 188, the plurality of other lower electrode layers and the ninth lower electrode layer 189 may be disposed adjacent to a center of the lower stack structure 100. The seventh lower electrode layer 187, the eighth lower electrode layer 188, the plurality of other lower electrode layers, the ninth lower electrode layer 189 and the tenth lower electrode layer 190 may have substantially the same thickness. For example, each of the seventh lower electrode layer 187 and the eighth lower electrode layer 188 may have the 16-th thickness T16.

Each of the first to sixth lower electrode layers 181 to 186 may have a greater thickness than the 16-th thickness T16. In an exemplary embodiment, the third thickness T3 of the first lower electrode layer 181 may be greater than the 16-th thickness T16. The 5-th thickness T5 of the second lower electrode layer 182 may be substantially equal to the third thickness T3 of the first lower electrode layer 181. The 7-th thickness T7 of the third lower electrode layer 183 may be greater than the third thickness T3 of the first lower electrode layer 181. The 10-th thickness T10 of the fourth lower electrode layer 184 may be smaller than the third thickness T3 of the first lower electrode layer 181. The 12-th thickness T12 of the fifth lower electrode layer 185 may be smaller than the 10-th thickness T10 of the fourth lower electrode layer 184. The 14-th thickness T14 of the sixth lower electrode layer 186 may be smaller than the 12-th thickness T12 of the fifth lower electrode layer 185. In an exemplary embodiment, the 14-th thickness T14 of the sixth lower electrode layer 186 may be substantially equal to the 16-th thickness T16 of the seventh lower electrode layer 187. The 19-th thickness T19 of the eleventh lower electrode layer 191 may be greater than the 16-th thickness T16 of the seventh lower electrode layer 187. For example, the 19-th thickness T19 of the eleventh lower electrode layer 191 may be greater than the 7-th thickness T7 of the third lower electrode layer 183.

A plurality of other upper electrode layers may be disposed between the fifth upper electrode layer 285 and the sixth upper electrode layer 286. One of the fifth upper electrode layer 285, the plurality of other upper electrode layers and the sixth upper electrode layer 286 may be disposed adjacent to a center of the upper stack structure 200. The fourth upper electrode layer 284, the fifth upper electrode layer 285, the plurality of other upper electrode layers, the sixth upper electrode layer 286 and the seventh upper electrode layer 287 may have substantially the same thickness. For example, each of the fourth upper electrode layer 284 and the fifth upper electrode layer 285 may have the 28-th thickness T28. In an exemplary embodiment, the 28-th thickness T28 of the fourth upper electrode layer 284 may be substantially equal to the 16-th thickness T16 of the seventh lower electrode layer 187.

Each of the first to third upper electrode layers 281 to 283 may have a greater thickness than the 28-th thickness T28 of the fourth upper electrode layer 284. The 22-nd thickness T22 of the first upper electrode layer 281 may be greater than the 28-th thickness T28. The 22-nd thickness T22 of the first upper electrode layer 281 may be substantially equal to the 10-th thickness T10 of the fourth lower electrode layer 184. The 24-th thickness T24 of the second upper electrode layer 282 may be smaller than the 22-nd thickness T22 of the first upper electrode layer 281. The 26-th thickness T26 of the third upper electrode layer 281 may be smaller than the 24-th thickness T24 of the second upper electrode layer 282. In an exemplary embodiment, the 26-th thickness T26 of the third upper electrode layer 283 may be substantially equal to the 24-th thickness T24 of the second upper electrode layer 282.

Each of the eighth to eleventh upper electrode layers 288 to 291 may have a greater thickness than the 28-th thickness T28 of the fourth upper electrode layer 284. The 31-st thickness T31 of the eighth upper electrode layer 288 may be greater than the 28-th thickness T28. The 31-st thickness T31 of the eighth upper electrode layer 288 may be greater than the 22-nd thickness T22 of the first upper electrode layer 281. The 33-rd thickness T33 of the ninth upper electrode layer 289 may be substantially equal to the 31-st thickness T31. The 35-th thickness T35 of the tenth upper electrode layer 290 may be substantially equal to the 33-rd thickness T33 of the ninth upper electrode layer 289. The 37-th thickness T37 of the eleventh upper electrode layer 291 may be greater than the 35-th thickness T35 of the tenth upper electrode layer 290. The 37-th thickness T37 of the eleventh upper electrode layer 291 may be substantially equal to the 19-th thickness T19 of the eleventh lower electrode layer 191.

A plurality of other lower insulating layers may be disposed between the tenth lower insulating layer 170 and the eleventh lower insulating layer 171. One of the eighth to tenth lower insulating layers 168 to 170, the plurality of other lower insulating layers, the eleventh lower insulating layer 171 and the twelfth lower insulating layer 172 may be disposed adjacent to the center of the lower stack structure 100. The eighth to tenth lower insulating layers 168 to 170, the plurality of other lower insulating layers, the eleventh lower insulating layer 171 and the twelfth lower insulating layer 172 may have substantially the same thickness. For example, each of the ninth lower insulating layer 169 and the tenth lower insulating layer 170 may have the 17-th thickness T17. Each of the 15-th thickness T15 of the eighth lower insulating layer 168 and the 18-th thickness T18 of the thirteenth lower insulating layer 173 may be substantially equal to the 17-th thickness T17. In an exemplary embodiment, each of the 11-th thickness T11 of the sixth lower insulating layer 166 and the 13-th thickness T13 of the seventh lower insulating layer 167 may be substantially equal to the 15-th thickness T15 of the eighth lower insulating layer 168.

Each of the first to fifth lower insulating layers 161 to 165 may have a greater thickness than the 17-th thickness T17 of the ninth lower insulating layer 169. The second thickness T2 of the first lower insulating layer 161 may be greater than the 17-th thickness T17. The 4-th thickness T4 of the second lower insulating layer 162 may be greater than the second thickness T2 of the first lower insulating layer 161. The 6-th thickness T6 of the third lower insulating layer 163 may be substantially equal to the 4-th thickness T4 of the second lower insulating layer 162. The 8-th thickness T8 of the fourth lower insulating layer 164 may be greater than the 6-th thickness T6 of the third lower insulating layer 163. The 9-th thickness T9 of the fifth lower insulating layer 165 may be smaller than the 8-th thickness T8 of the fourth lower insulating layer 164 while being greater than the 11-th thickness T11 of the sixth lower insulating layer 166. The 20-th thickness T20 of the fourteenth lower insulating layer 174 may be greater than the 17-th thickness T17 of the ninth lower insulating layer 169. The 20-th thickness T20 of the fourteenth lower insulating layer 174 may be greater than the 8-th thickness T8 of the fourth lower insulating layer 164.

A plurality of other upper insulating layers may be disposed between the sixth upper insulating layer 266 and the seventh upper insulating layer 267. One of the fourth to sixth upper insulating layers 264 to 266, the plurality of other upper insulating layers and the seventh upper insulating layer 267 may be disposed adjacent to the center of the upper stack structure 200. The fourth to sixth upper insulating layers 264 to 266, the plurality of other upper insulating layers and the seventh upper insulating layer 267 may have substantially the same thickness. For example, the fifth upper insulating layer 265 and the sixth upper insulating layer 266 may have the 29-th thickness T29.

In an exemplary embodiment, each of the 21-st thickness T21 of the first upper insulating layer 261, the 23-rd thickness T23 of the second upper insulating layer 262, the 25-th thickness T25 of the third upper insulating layer 263 and the 27-th thickness T27 of the fourth upper insulating layer 264 may be substantially equal to the 29-th thickness T29 of the fifth upper insulating layer 265. Each of the ninth to thirteenth upper insulating layers 269 to 273 may have a greater thickness than the 29-th thickness T29 of the fifth upper insulating layer 265. The 30-th thickness T30 of the ninth upper insulating layer 269 may be greater than the 29-th thickness T29. The 32-nd thickness T32 of the tenth upper insulating layer 270 may be substantially equal to the 30-th thickness T30 of the ninth upper insulating layer 269. The 34-th thickness T34 of the eleventh upper insulating layer 271 may be substantially equal to the 32-nd thickness T32 of the tenth upper insulating layer 270. The 36-th thickness T36 of the twelfth upper insulating layer 272 may be substantially equal to the 34-th thickness T34 of the eleventh upper insulating layer 271. The 38-th thickness T38 of the thirteenth upper insulating layer 273 may be greater than the 36-th thickness T36 of the twelfth upper insulating layer 272.

In an exemplary embodiment, among the plurality of lower electrode layers 181 to 191, the eleventh lower electrode layer 191 may be disposed nearest to the interface S1 between the lower stack structure 100 and the upper stack structure 200. The eleventh lower electrode layer 191 may be referred to as a "first lower electrode layer". One of the seventh lower electrode layer 187, the eighth lower electrode layer 188, the plurality of other lower electrode layers and the ninth lower electrode layer 189, which is disposed adjacent to the center of the lower stack structure 100, may be referred to as a "second lower electrode layer". Among the plurality of lower electrode layers 181 to 191, the first lower electrode layer 181 may be disposed farthest from the upper stack structure 200. The first lower electrode layer 181 may be referred to as a "third lower electrode layer".

In an exemplary embodiment, among the plurality of upper electrode layers 281 to 291, the first upper electrode layer 281 may be disposed nearest to the interface S1. One of the fifth upper electrode layer 285, the plurality of other upper electrode layers and the sixth upper electrode layer 286, which is disposed adjacent to the center of the upper stack structure 200, may be referred to as a "second upper electrode layer". Among the plurality of upper electrode layers 281 to 291, the eleventh upper electrode layer 291 may be disposed farthest from the lower stack structure 100. The eleventh upper electrode layer 291 may be referred to as a "third upper electrode layer". The second upper electrode layer 282 disposed adjacent to the first upper electrode layer 281 may be referred to as a "fourth upper electrode layer".

In an exemplary embodiment, the fourteenth lower insulating layer 174 and the first upper insulating layer 261 may be disposed between the eleventh lower electrode layer 191 and the first upper electrode layer 281. The fourteenth lower insulating layer 174 and the first upper insulating layer 261 may contact each other. The interface S1 may be formed between the fourteenth lower insulating layer 174 and the first upper insulating layer 261. The fourteenth lower insulating layer 174 and the first upper insulating layer 261 may directly contact the interface S1. The fourteenth lower insulating layer 174 may be referred to as a "first lower insulating layer". One of the eighth to tenth lower insulating layers 168 to 170, the plurality of other lower insulating layers, the eleventh lower insulating layer 171 and the twelfth lower insulating layer 172, which is disposed adjacent to the center of the lower stack structure 100, may be referred to as a "second lower insulating layer".

Figure 5:
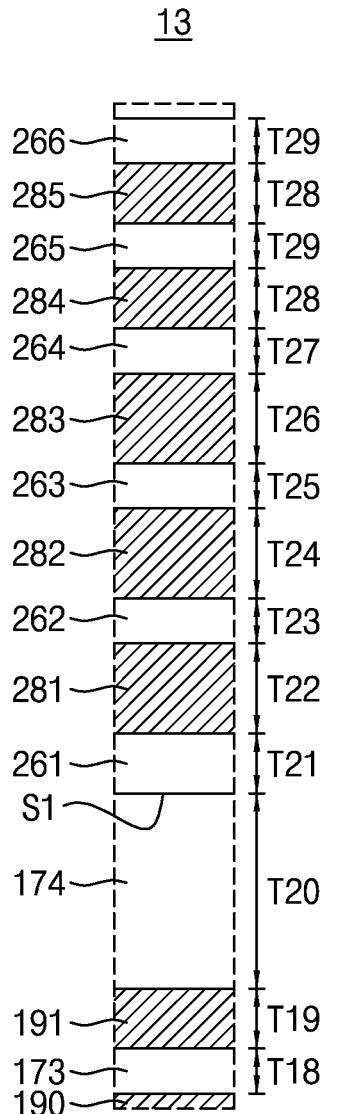

Referring to FIG. 5, the 19-th thickness T19 of the eleventh lower electrode layer 191 may be substantially equal to the 16-th thickness T16 of the seventh lower electrode layer 187. The 22-nd thickness T22 of the first upper electrode layer 281 may be greater than the 28-th thickness T28 of the fourth upper electrode layer 284.

Figure 6:
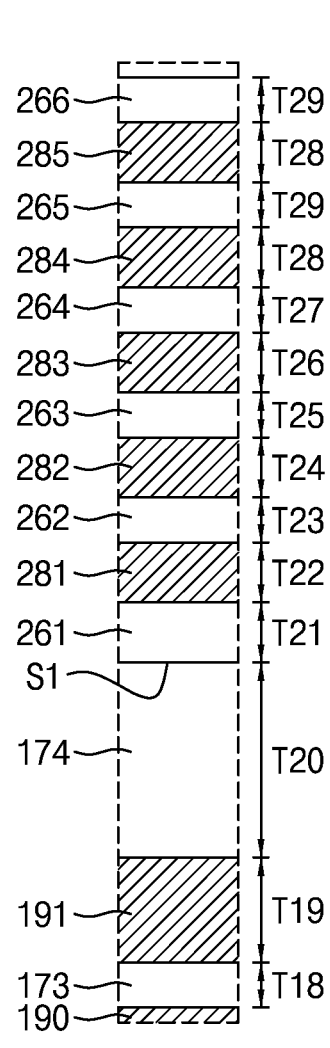

Referring to FIG. 6, each of the first to third upper electrode layers 281 to 283 may have substantially the same thickness as the 28-th thickness T28 of the fourth upper electrode layer 284. The 19-th thickness T19 of the eleventh lower electrode layer 191 may be greater than the 16-th thickness T16 of the seventh lower electrode layer 187.

Referring to FIG. 7, the first upper electrode layer 281 may directly contact the fourteenth lower insulating layer 174. The interface S1 may be formed between the first upper electrode layer 281 and the fourteenth lower insulating layer 174. The 19-th thickness T19 of the eleventh lower electrode layer 191 may be substantially equal to the 16-th thickness T16 of the seventh lower electrode layer 187.

Referring to FIG. 8, each of the first to third upper electrode layers 281 to 283 may have substantially the same thickness as the 28-th thickness T28 of the fourth upper electrode layer 284. The first upper electrode layer 281 may directly contact the fourteenth lower insulating layer 174. The interface S1 may be formed between the first upper electrode layer 281 and the fourteenth lower insulating layer 174.

Referring to FIG. 9, each of the plurality of channel structures 350 may include a core pattern 357, a channel layer 356 surrounding an outside of the core pattern 357, an information storage pattern 355 surrounding an outside of the channel layer 356, and a bit pad 358 disposed on the channel layer 356. The information storage pattern 355 may include a tunnel insulating layer 353 surrounding the outside of the channel layer 356, a charge storage layer 352 surrounding an outside of the tunnel insulating layer 353, and an upper blocking layer 351B surrounding an outside of the charge storage layer 352. Each of the plurality of bit plugs 375 may directly contact the bit pad 358 while extending through the fourth interlayer insulating layer 332.

The core pattern 357 may include silicon oxide, silicon nitride, silicon oxynitride, low-K dielectrics, high-K dielectrics, polysilicon, or a combination thereof. The channel layer 356 may include a semiconductor layer such as polysilicon, amorphous silicon, monocrystalline silicon, or a combination thereof. The tunnel insulating layer 353 may include an insulating layer such as silicon oxide. The charge storage layer 352 may include an insulating layer such as silicon nitride. The upper blocking layer 351B may include silicon oxide, silicon nitride, silicon oxynitride, high-K dielectrics, or a combination thereof. The bit pad 358 may include a conductive layer such as metal, metal nitride, metal oxide, metal silicide, conductive carbon, polysilicon, or a combination thereof.

Referring to FIG. 10, the information storage pattern 355 may include a tunnel insulating layer 353, a charge storage layer 353, and a lower blocking layer 351A. The lower blocking layer 351A may include a material substantially identical to that of the upper blocking layer 351B.

Referring to FIG. 11, the connecting conductive layer 55 may be disposed between the support 57 and the horizontal conductive layer 51. The connecting conductive layer 55 may directly contact a side surface of the channel layer 356 while extending through a side surface of the information storage pattern 355. For example, the connecting conductive layer 55 may directly contact the side surface of the channel layer 356 while extending through the lower blocking layer 351A, the charge storage layer 352 and the tunnel insulating layer 353.

Again referring to FIG. 1 and FIGS. 9 to 11, the blocking layer 351A/351B may include the lower blocking layer 351A disposed in the lower stack structure 100, and the upper blocking layer 351B disposed in the upper stack structure 200. The blocking layer 351A/351B may be disposed outside the channel layer 356. The charge storage layer 352 may be disposed between the channel layer 356 and the blocking layer 351A/351B. The tunnel insulating layer 353 may be disposed between the channel layer 356 and the charge storage layer 352. The connecting conductive layer 55 may directly contact the side surface of the channel layer 356 while extending through the blocking layer 351A/351B, the charge storage layer 352 and the tunnel insulating layer 353.

Figure 12:
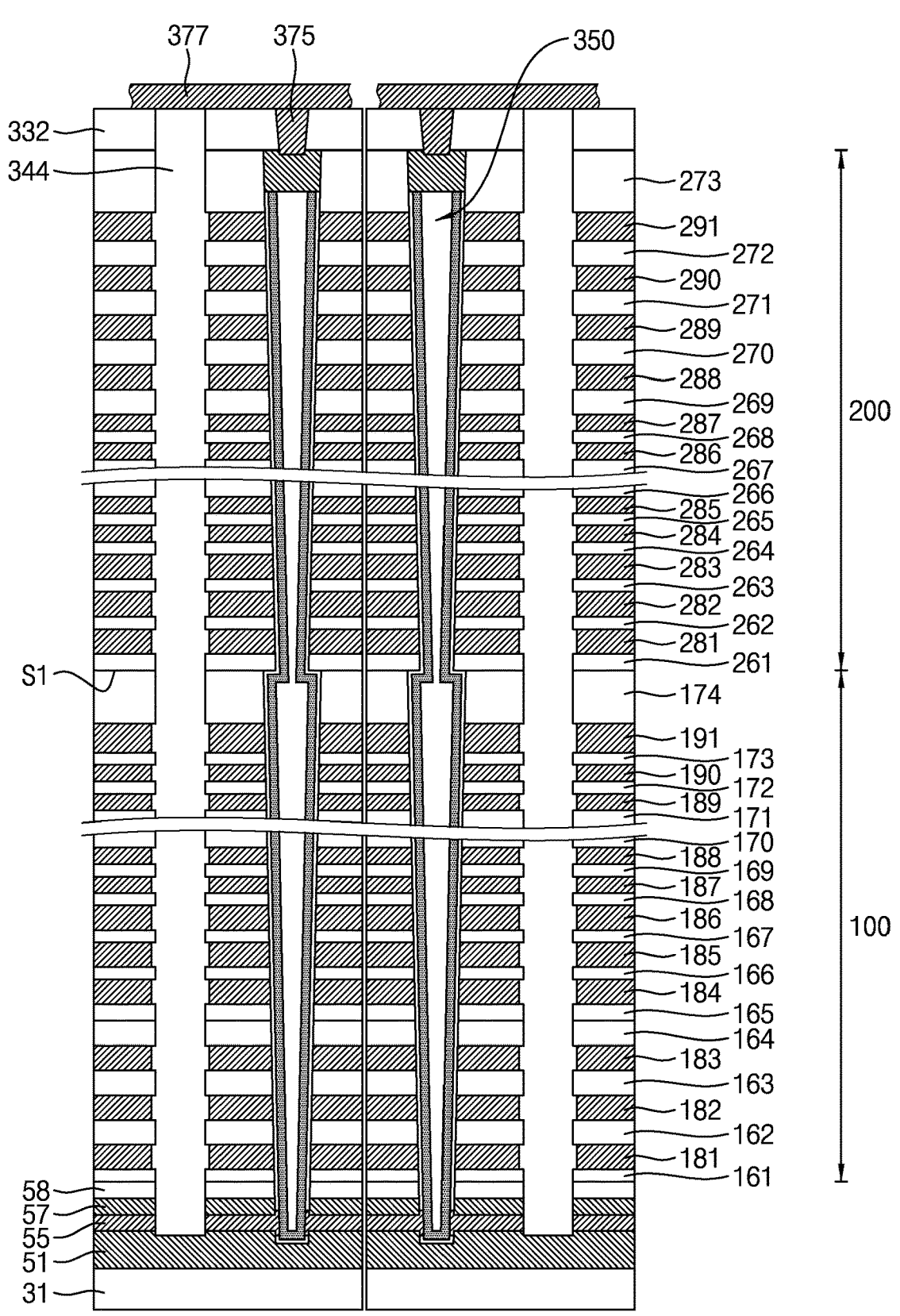

FIG. 12 is a sectional view explaining semiconductor devices according to exemplary embodiments of the disclosure.

Referring to FIG. 12, each of the semiconductor devices according to the exemplary embodiments of the disclosure may include a substrate 31, a horizontal conductive layer 51, a connecting conductive layer 55, a support 57, a third interlayer insulating layer 58, a lower stack structure 100, an upper stack structure 200, a plurality of channel structures 350, a fourth interlayer insulating layer 322, a plurality of isolation patterns 344, a plurality of bit plugs 375, and a plurality of bit lines 377. The horizontal conductive layer 51 may be disposed on the substrate 31. In an exemplary embodiment, the horizontal conductive layer 51 may be formed in the substrate 31.

FIGS. 13 to 19 are sectional views explaining a method for forming semiconductor devices according to exemplary embodiments of the disclosure.

Figure 13:
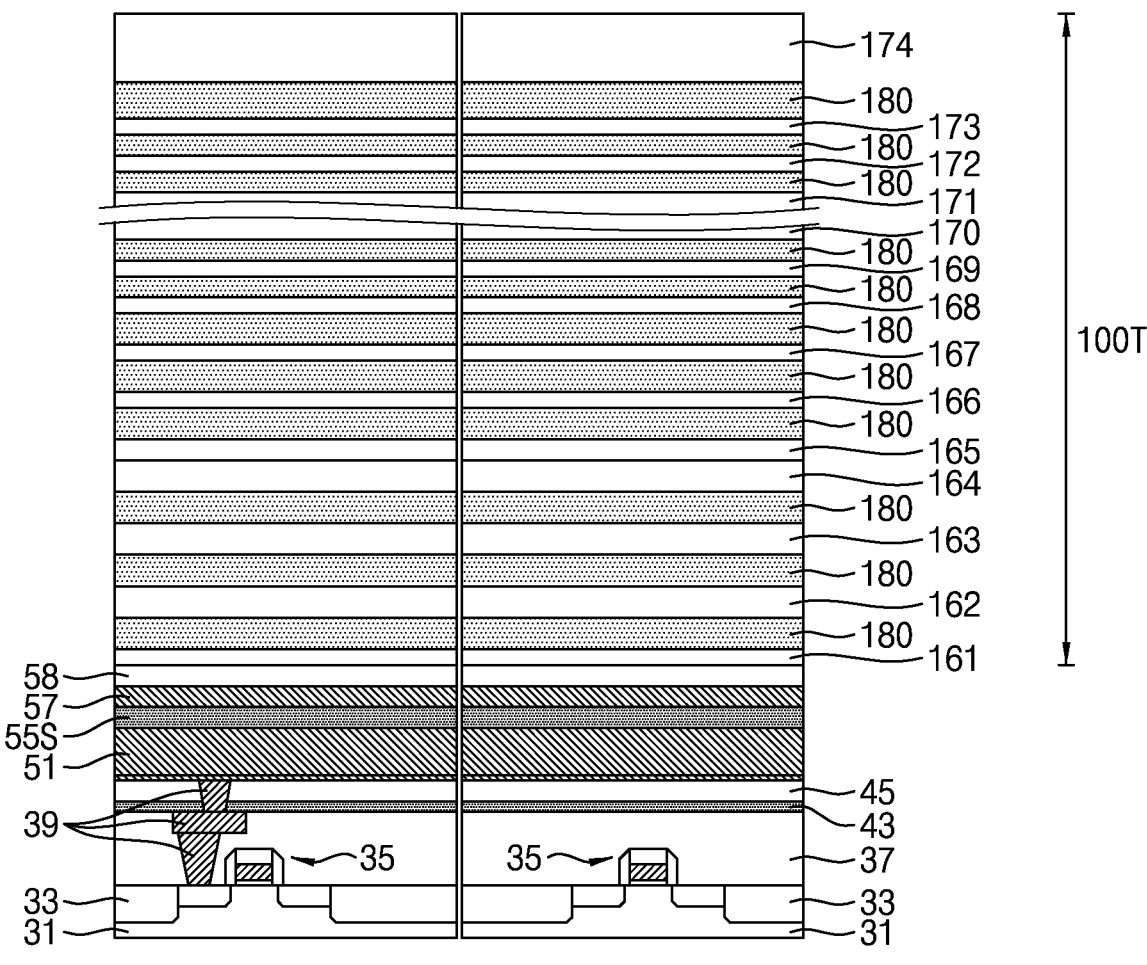
FIGS. 13 to 19 are sectional views that illustrate methods of forming semiconductor devices according to exemplary embodiments of the disclosure.

Referring to FIG. 13, an element isolation layer 33, a plurality of transistors 35, a first interlayer insulating layer 37, a plurality of peripheral circuit wirings 39, a capping layer 43, and a second interlayer insulating layer 45 may be formed on a substrate 31.

The substrate 31 may include a semiconductor substrate such as a silicon wafer. The element isolation layer 33 may include an insulating layer formed using a shallow trench isolation (STI) method. The plurality of transistors 35 may be formed in the substrate 31 and/or on the substrate 31 using various methods. Each of the plurality of transistors 35 may include a fin field effect transistor (finFET), a multi-bridge channel (MBC) transistor, a nanowire transistor, a vertical transistor, a recess channel transistor, a 3-D transistor, a planar transistor, or a combination thereof.

The first interlayer insulating layer 37 may be formed on the substrate 31 to cover the plurality of transistors 35 and the element isolation layer 33. The capping layer 43 may be formed on the first interlayer insulating layer 37. In an exemplary embodiment, the capping layer 43 may include silicon nitride, silicon oxynitride, silicon boron nitride (SiBN), silicon carbon nitride (SiCN), or a combination thereof. The second interlayer insulating layer 45 may be formed on the capping layer 43.

The plurality of peripheral circuit wirings 39 may be formed in the first interlayer insulating layer 37, the capping layer 43 and the second interlayer insulating layer 45. Each of the plurality of peripheral circuit wirings 39 may include metal, metal nitride, metal silicide, metal oxide, conductive carbon, polysilicon, or a combination thereof. The plurality of peripheral circuit wirings 39 may be connected to the plurality of transistors 35. The plurality of peripheral circuit wirings 39 may include horizontal and vertical wirings having various shapes. The plurality of transistors 35 and the plurality of peripheral circuit wirings 39 may constitute a peripheral circuit.

The horizontal conductive layer 51 may be formed on the second interlayer insulating layer 45. A connecting mold layer 55S, the support 57 and the third interlayer insulating layer 58 may be formed on the horizontal conductive layer 51. In an exemplary embodiment, the horizontal conductive layer 51 may be electrically connected to a selected one of the plurality of peripheral circuit wirings 39. The horizontal conductive layer 51 may include metal, metal nitride, metal silicide, metal oxide, conductive carbon, polysilicon, or a combination thereof. For example, the horizontal conductive layer 51 may include a doped polysilicon layer. The horizontal conductive layer 51 may be a single layer or multiple layers. The connecting mold layer 55S may include a material having etch selectively with respect to the horizontal conductive layer 51. The connecting mold layer 55S may be a single layer or multiple layers. For example, the connecting mold layer 55S may include an oxide layer, a nitride layer and an oxide layer which are sequentially stacked. The support 57 may include a material having etch selectivity with respect to the connecting mold layer 55S. For example, the support 57 may include a polysilicon layer.

Each of the element isolation layer 33, the first interlayer insulating layer 37, the second interlayer insulating layer 45 and the third interlayer insulating layer 58 may include silicon oxide, silicon nitride, silicon oxynitride, low-K dielectrics, high-K dielectrics, or a combination thereof.

A preliminary lower stack structure 100T may be formed on the third interlayer insulating layer 58. The preliminary stack structure 100T may include a plurality of lower insulating layers 161 to 174 and a plurality of lower mold layers 180 which are alternately repeatedly stacked. Each of the plurality of lower mold layers 180 may have substantially the same thickness as a corresponding one of the plurality of lower electrode layers 181 to 191 described with reference to FIGS. 1 to 8. The plurality of lower mold layers 180 may include a material having etch selectivity with respect to the plurality of lower insulating layers 161 to 174. In an exemplary embodiment, the plurality of lower insulating layers 161 to 174 may include a silicon oxide layer, and the plurality of lower mold layers 180 may include a silicon nitride layer. In an exemplary embodiment, the plurality of lower mold layers 180 may include a polysilicon layer.

Figure 14:
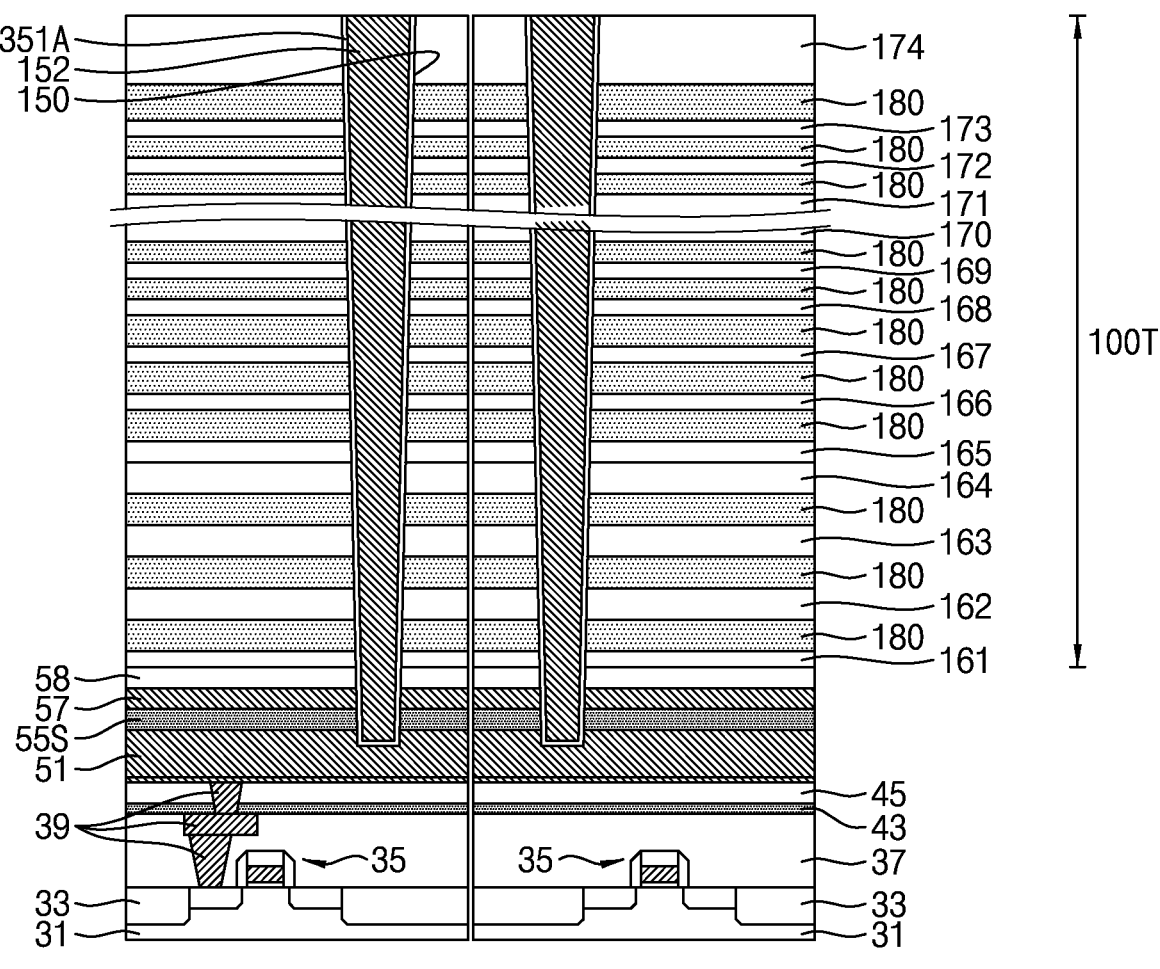

Referring to FIG. 14, a plurality of lower channel holes 150 may be formed to extend to an inside of the horizontal conductive layer 51 while extending through the preliminary lower stack structure 100T, the third interlayer insulating layer 58, the support 57 and the connecting mold layer 55S. A lower blocking layer 351A may be formed on side walls and bottoms of the plurality of lower channel holes 150. A sacrificial layer 152 may be formed on the lower blocking layer 351A to fill the plurality of lower channel holes 150.

The sacrificial layer 152 may include a material having etch selectivity with respect to the lower blocking layer 351A. The lower blocking layer 351A may include an insulating layer such as silicon oxide, silicon nitride, silicon oxynitride, high-K dielectrics, or a combination thereof. In an exemplary embodiment, the lower blocking layer 351A may include a silicon oxide layer, and the sacrificial layer 152 may include a polysilicon layer.

Figure 15:
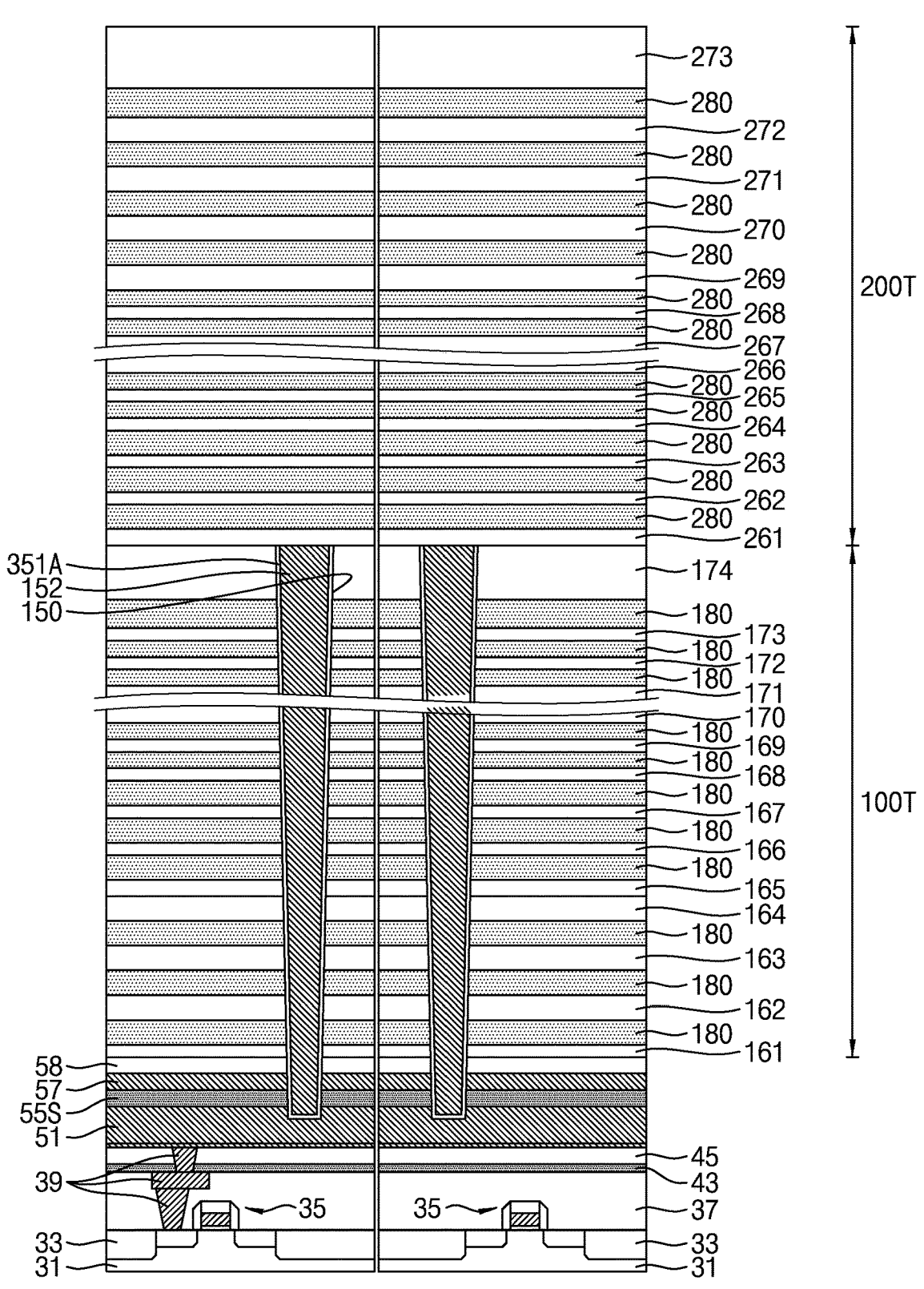

Referring to FIG. 15, a preliminary upper stack structure 200T may be formed on the preliminary lower stack structure 100T. The preliminary upper stack structure 200T may include a plurality of upper insulating layers 261 to 273 and a plurality of upper mold layers 280 which are alternately repeatedly stacked. Each of the plurality of upper mold layers 280 may have substantially the same thickness as a corresponding one of the plurality of upper electrode layers 281 to 291 described with reference to FIGS. 1 to 8. The plurality of upper mold layers 280 may include a material having etch selectivity with respect to the plurality of upper insulating layers 261 to 273. In an exemplary embodiment, the plurality of upper insulating layers 261 to 273 may include a silicon oxide layer, and the plurality of upper mold layers 280 may include a silicon nitride layer. In an exemplary embodiment, the plurality of upper mold layers 280 may include a polysilicon layer. The plurality of upper mold layers 280 may include the same material as the plurality of lower mold layers 180.

Figure 16:
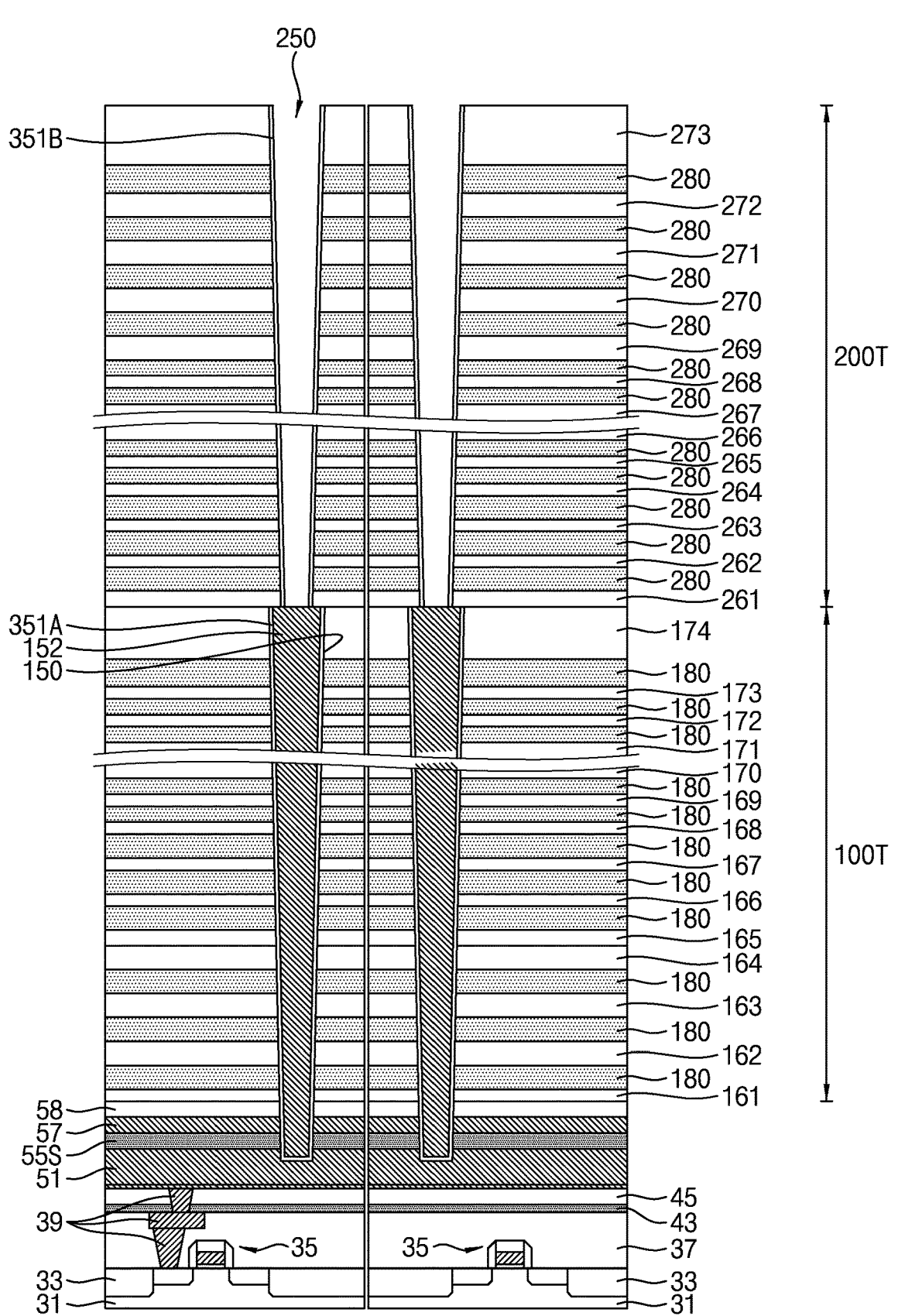

Referring to FIG. 16, a plurality of upper channel holes 250 may be formed to expose the sacrificial layer 152 while extending through the preliminary upper stack structure 200T. An upper blocking layer 351B may be formed on side walls of the plurality of upper channel holes 250. The upper block layer 351B may include silicon oxide, silicon nitride, silicon oxynitride, high-K dielectrics, or a combination thereof. In an exemplary embodiment, the upper blocking layer 351B may include a silicon oxide layer. The upper blocking layer 351B may include the same material as the lower blocking layer 351A.

Figure 17:
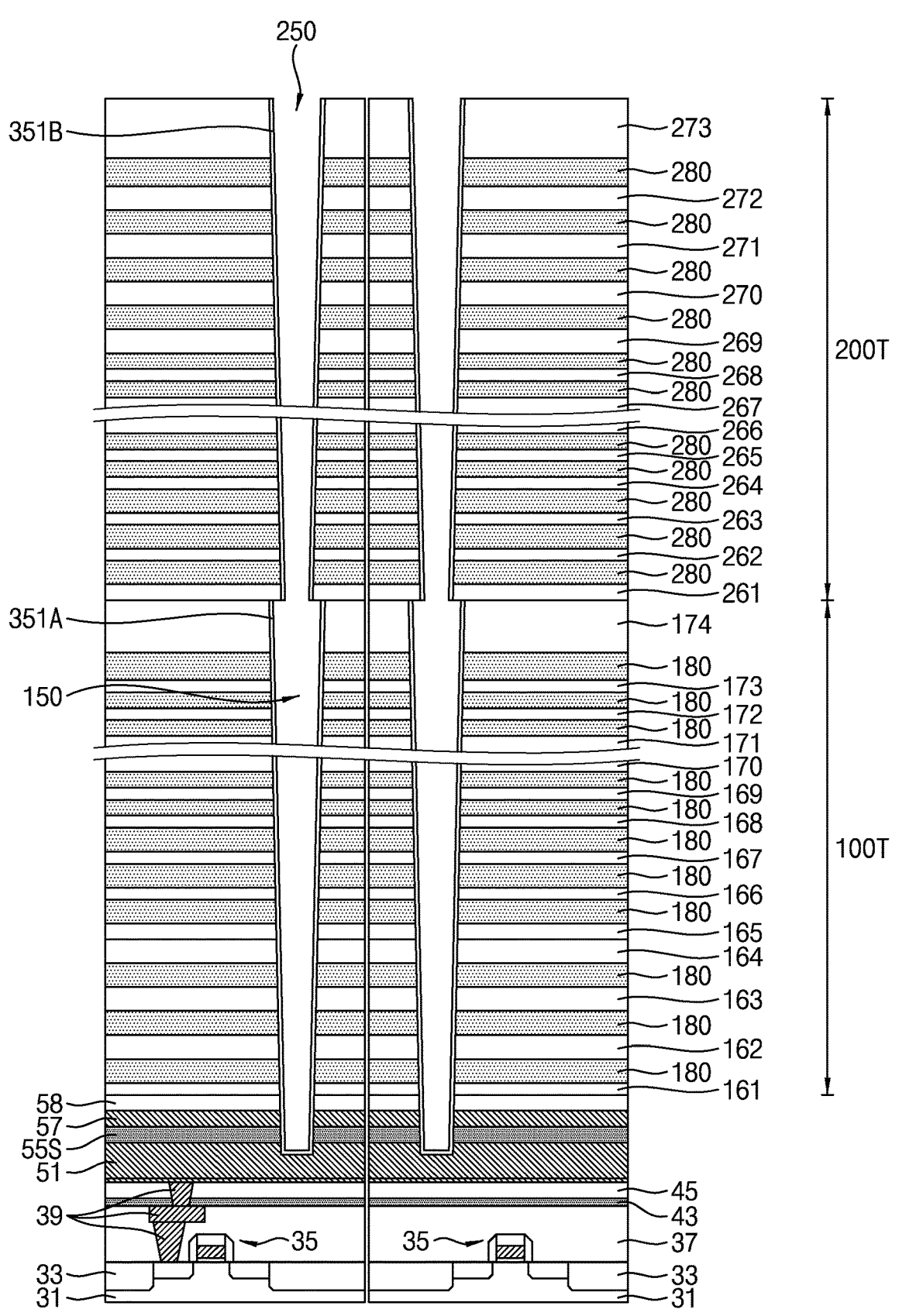

Referring to FIG. 17, each of the plurality of upper channel holes 250 may communicate with a corresponding one of the plurality of lower channel holes 150 through removal of the sacrificial layer 152. The lower blocking layer 351A may remain on the side walls and bottoms of the plurality of lower channel holes 150. The upper blocking layer 351B may remain on the side walls of the plurality of upper channel holes 250.

Figure 18:
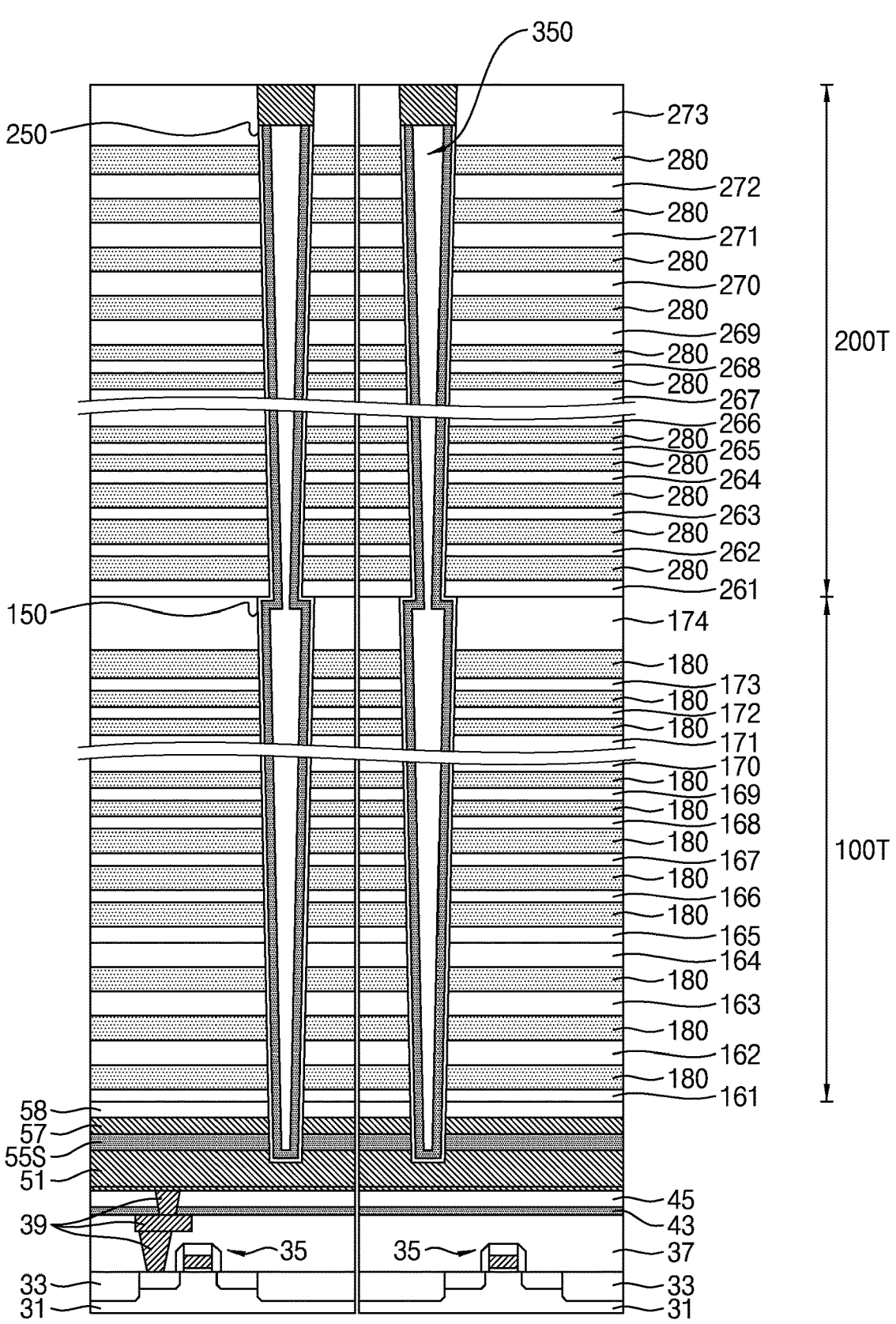

Referring to FIG. 18, a plurality of channel structures 350 may be formed in the plurality of upper channel holes 250 and the plurality of lower channel holes 150. Each of the plurality of channel structures 350 may include a configuration similar to the configuration described with reference to FIGS. 9 and 10. For example, each of the channel structures 350 may include an information storage pattern 355, a channel layer 356, a core pattern 357 and a bit pad 358. The information storage pattern 355 may include a blocking layer 351A/351B, a charge storage layer 352, and a tunnel insulating layer 353. The blocking layer 351A/351B may include the lower blocking layer 351A and the upper blocking layer 351B.

Figure 19:
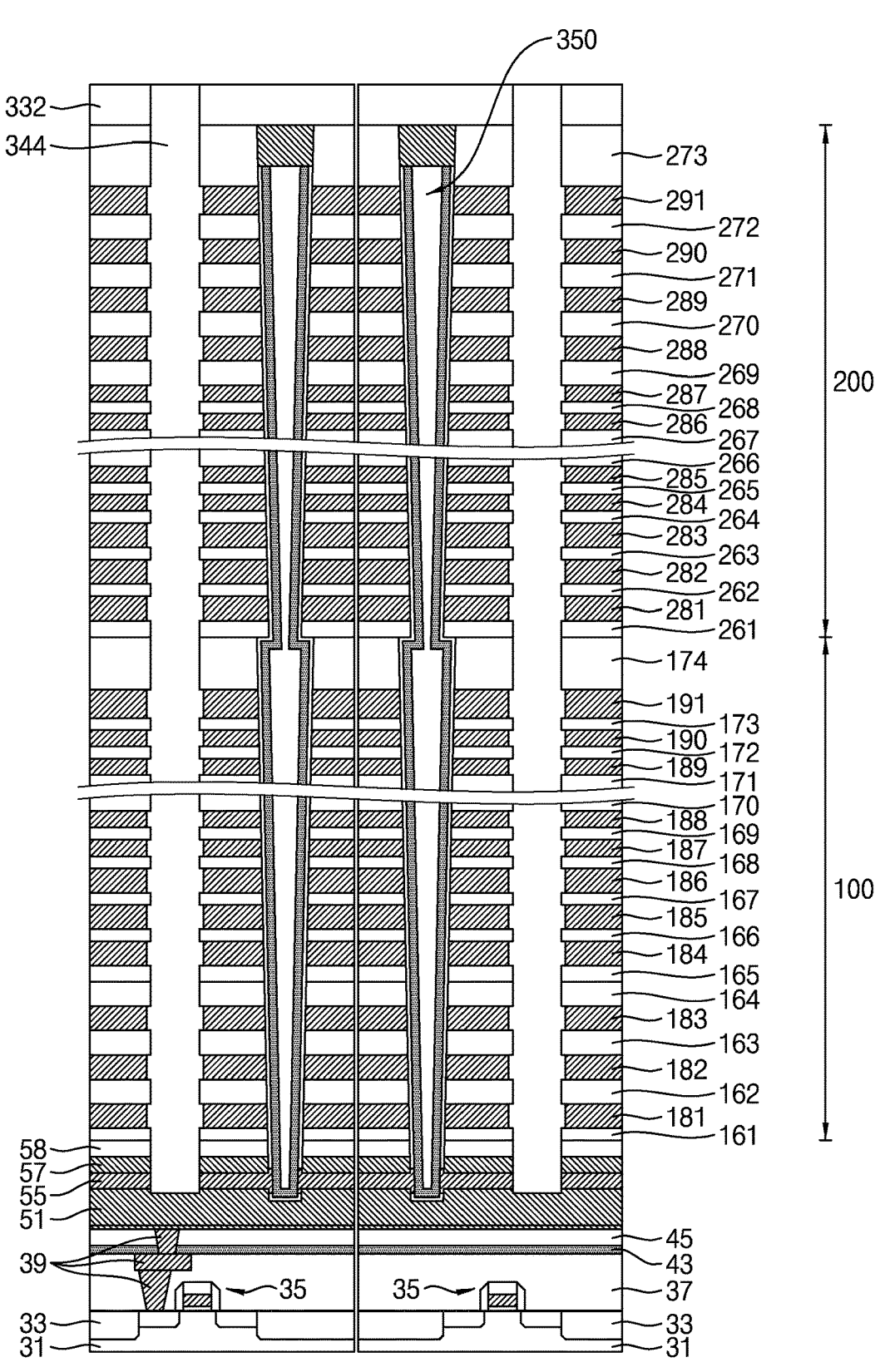

Referring to FIG. 19, a fourth interlayer insulating layer 332 may be formed on the preliminary upper stack structure 200T to cover the plurality of channel structures 350. The fourth interlayer insulating layer 332 may include silicon oxide, silicon nitride, silicon oxynitride, low-K dielectrics, high-K dielectrics, or a combination thereof.

A connecting conductive layer 55 may be formed after removal of the connecting mold layer 55S. As shown in FIG. 11, the connecting conductive layer 55 may directly contact a side surface of the channel layer 356 while extending through a side surface of the information storage pattern 355. The connecting conductive layer 55 may include metal, metal nitride, metal silicide, metal oxide, conductive carbon, polysilicon, or a combination thereof. For example, the connecting conductive layer 55 may include a doped polysilicon layer.

A plurality of lower electrode layers 181 to 191 may be formed after removal of the plurality of lower mold layers 180. The plurality of lower insulating layers 161 to 174 and the plurality of lower electrode layers 181 to 191, which are alternately repeatedly stacked, may constitute a lower stack structure 100. A plurality of upper electrode layers 281 to 291 may be formed after removal of the plurality of upper mold layers 280. The plurality of upper insulating layers 261 to 273 and the plurality of upper electrode layers 281 to 291, which are alternately repeatedly stacked, may constitute an upper stack structure 200. Each of the plurality of lower electrode layers 181 to 191 and the plurality of upper electrode layers 281 to 291 may include metal, metal nitride, metal silicide, metal oxide, conductive carbon, polysilicon, or a combination thereof. Each of the plurality of lower electrode layers 181 to 191 and the plurality of upper electrode layers 281 to 291 may be a single layer or multiple layers. For example, each of the plurality of lower electrode layers 181 to 191 and the plurality of upper electrode layers 281 to 291 may include W, WN, Ti, TiN, Ta, TaN, Ru, Pt, Ag, or a combination thereof.

A plurality of isolation patterns 344 may be formed to extend to an inside of the connecting conductive layer 55 while extending through the fourth interlayer insulating layer 332, the upper stack structure 200, the lower stack structure 100, the third interlayer insulating layer 58 and the support 57. In an exemplary embodiment, the plurality of separation patterns 344 may extend to an inside of the horizontal conductive layer 51 while extending through the connecting conductive layer 55. The plurality of separation patterns 344 may include silicon oxide, silicon nitride, silicon oxynitride, low-K dielectrics, high-K dielectrics, or a combination thereof.

Again referring to FIG. 1, a plurality of bit plugs 375 may be formed to be connected to the plurality of channel structures 350 while extending through the fourth interlayer insulating layer 332. A plurality of bit lines 377 may be formed on the fourth interlayer insulating layer 332 to contact the plurality of bit plugs 375. The plurality of bit plugs 375 and the plurality of bit lines 377 may include metal, metal nitride, metal silicide, metal oxide, conductive carbon, polysilicon, or a combination thereof.

In accordance with exemplary embodiments of the disclosure, a channel structure extending through an upper stack structure and a lower stack structure may be provided. At least one electrode layer disposed adjacent to an interface between the lower stack structure and the upper stack structure may be thicker than a lower electrode layer disposed adjacent to a center of the lower stack structure. By virtue of the configuration of the thick electrode layer, the process margin of the channel structure may increase. Semiconductor devices capable of controlling electrical characteristics of elements disposed adjacent to the interface may be realized.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device, comprising:
a lower stack structure;
an upper stack structure on the lower stack structure; and
a channel structure penetrating through the lower and upper stack structures,
wherein the lower stack structure includes lower insulating layers and lower conductive layers alternately stacked in a vertical direction,
wherein the upper stack structure includes upper insulating layers and upper conductive layers alternately stacked in the vertical direction,
wherein the lower conductive layers include:
a first lowermost layer;
a first uppermost layer; and
first intermediate layers between the first lowermost layer and the first uppermost layer,
wherein the upper conductive layers include:
a second lowermost layer;
a second uppermost layer; and
second intermediate layers between the second lowermost layer and the second uppermost layer,
wherein the first lowermost layer is a lowermost layer among the lower conductive layers,
wherein the first uppermost layer is an uppermost layer among the lower conductive layers,
wherein the second lowermost layer is a lowermost layer among the upper conductive layers,
wherein the second uppermost layer is an uppermost layer among the upper conductive layers,
wherein the first intermediate layers include:
a first lower layer, a second lower layer, a third lower layer, a fourth lower layer, and a fifth lower layer sequentially stacked on the first lowermost layer; and
a lower word line adjacent to a center of the lower stack structure and at a higher level than the fifth lower layer,
wherein the second intermediate layers include:
a first upper layer and a second upper layer sequentially stacked on the second lowermost layer;
an upper word line adjacent to a center of the upper stack structure and at a higher level than the second upper layer; and
a third upper layer, a fourth upper layer, and a fifth upper layer sequentially stacked and at a higher level than the upper word line, wherein the fifth upper layer is adjacent to the second uppermost layer, and
wherein a thickness in the vertical direction of each of the first lowermost layer, the first uppermost layer, the second lowermost layer, and the second uppermost layer is greater than a thickness in the vertical direction of each of the lower word line and the upper word line.

2. The semiconductor device as claimed in claim 1,
wherein a distance between the first uppermost layer and the second lowermost layer is greater than the thickness in the vertical direction of each of the first lowermost layer, the first uppermost layer, the second lowermost layer, and the second uppermost layer.

3. The semiconductor device as claimed in claim 1,
wherein a thickness in the vertical direction of at least one of the first, second, third, fourth, and fifth lower layers is greater than the thickness in the vertical direction of each of the lower word line and the upper word line.

4. The semiconductor device as claimed in claim 1,
wherein a thickness in the vertical direction of the second lower layer is greater than a thickness in the vertical direction of at least one of the first lowermost layer, the first lower layer, the third lower layer, the fourth lower layer, and the fifth lower layer.

5. The semiconductor device as claimed in claim 4,
wherein the thickness in the vertical direction of the first uppermost layer is greater than the thickness in the vertical direction of the second lower layer.

6. The semiconductor device as claimed in claim 1,
wherein the thickness in the vertical direction of the first uppermost layer is greater than the thickness in the vertical direction of each of the first lowermost layer, the first lower layer, the second lower layer, the third lower layer, the fourth lower layer, and the fifth lower layer.

7. The semiconductor device as claimed in claim 1,
wherein the thickness in the vertical direction of the first uppermost layer is greater than the thickness in the vertical direction of the second lowermost layer.

8. The semiconductor device as claimed in claim 1,
wherein a thickness in the vertical direction of at least one of the first upper layer and the second upper layer is greater than the thickness in the vertical direction of each of the lower word line and the upper word line.

9. The semiconductor device as claimed in claim 8,
wherein the thickness in the vertical direction of the second lowermost layer is greater than the thickness in the vertical direction of at least one of the first upper layer and the second upper layer.

10. The semiconductor device as claimed in claim 1,
wherein the thickness in the vertical direction of the second uppermost layer is greater than the thickness in the vertical direction of the second lowermost layer.

11. The semiconductor device as claimed in claim 1,
wherein a thickness in the vertical direction of at least one of the third upper layer, the fourth upper layer, and the fifth upper layer is greater than the thickness in the vertical direction of each of the lower word line and the upper word line.

12. The semiconductor device as claimed in claim 1,
wherein the lower insulating layers include:
a first lower insulating layer between the first lowermost layer and the first lower layer;
a second lower insulating layer between the first lower layer and the second lower layer;
a third lower insulating layer between the third lower layer and the fourth lower layer; and a fourth lower insulating layer adjacent to the lower word line in the vertical direction, wherein the upper insulating layers include:

a first upper insulating layer between the second lowermost layer and the first upper layer;

a second upper insulating layer between the first upper layer and the second upper layer;

a third upper insulating layer adjacent to the upper word line in the vertical direction;

a fourth upper insulating layer between the third upper layer and the fourth upper layer;

a fifth upper insulating layer between the fourth upper layer and the fifth upper layer; and a sixth upper insulating layer between the fifth upper layer and the second uppermost layer.

13. The semiconductor device as claimed in claim 12, wherein a thickness in the vertical direction of at least one of the first lower insulating layer and the second lower insulating layer is greater than a thickness in the vertical direction of at least one of the third lower insulating layer and the fourth lower insulating layer.

14. The semiconductor device as claimed in claim 13, wherein a distance between the second lower layer and the third lower layer is greater than the thickness in the vertical direction of at least one of the first lower insulating layer and the second lower insulating layer.

15. The semiconductor device as claimed in claim 13, wherein the thickness in the vertical direction of at least one of the first lower insulating layer and the second lower insulating layer is greater than a thickness in the vertical direction of at least one of the first upper insulating layer and the second upper insulating layer.

16. The semiconductor device as claimed in claim 12, wherein the thickness in the vertical direction of at least one of the fourth upper insulating layer, the fifth upper insulating layer, and the sixth upper insulating layer is greater than a thickness in the vertical direction of at least one of the first upper insulating layer and the third upper insulating layer.

17. A semiconductor device, comprising:

a lower stack structure;

an upper stack structure on the lower stack structure; and a channel structure penetrating through the lower and upper stack structures, wherein the lower stack structure includes lower insulating layers and lower conductive layers alternately stacked in a vertical direction, wherein the upper stack structure includes upper insulating layers and upper conductive layers alternately stacked in the vertical direction, wherein the lower conductive layers include:

a first lowermost layer;

a first uppermost layer; and first intermediate layers between the first lowermost layer and the first uppermost layer, wherein the upper conductive layers include:

a second lowermost layer;

a second uppermost layer; and second intermediate layers between the second lowermost layer and the second uppermost layer, wherein the first lowermost layer is a lowermost layer among the lower conductive layers, wherein the first uppermost layer is an uppermost layer among the lower conductive layers, wherein the second lowermost layer is a lowermost layer among the upper conductive layers, wherein the second uppermost layer is an uppermost layer among the upper conductive layers, wherein the first intermediate layers include:

a first lower layer, a second lower layer, a third lower layer, a fourth lower layer, and a fifth lower layer sequentially stacked on the first lowermost layer; and a lower word line adjacent to a center of the lower stack structure and at a higher level than the fifth lower layer, wherein the second intermediate layers include:

a first upper layer and a second upper layer sequentially stacked on the second lowermost layer;

an upper word line adjacent to a center of the upper stack structure and at a higher level than the second upper layer; and a third upper layer, a fourth upper layer, and a fifth upper layer sequentially stacked and at a higher level than the upper word line, wherein the fifth upper layer is adjacent to the second uppermost layer, wherein the lower insulating layers include:

a first lower insulating layer between the first lowermost layer and the first lower layer;

a second lower insulating layer between the first lower layer and the second lower layer;

a third lower insulating layer between the third lower layer and the fourth lower layer; and a fourth lower insulating layer adjacent to the lower word line in the vertical direction, wherein the upper insulating layers include:

a first upper insulating layer between the second lowermost layer and the first upper layer;

a second upper insulating layer between the first upper layer and the second upper layer;

a third upper insulating layer adjacent to the upper word line in the vertical direction;

a fourth upper insulating layer between the third upper layer and the fourth upper layer;

a fifth upper insulating layer between the fourth upper layer and the fifth upper layer; and a sixth upper insulating layer between the fifth upper layer and the second uppermost layer, wherein a thickness in the vertical direction of each of the first lowermost layer and the second uppermost layer is greater than a thickness in the vertical direction of each of the lower word line and the upper word line, and wherein a thickness in the vertical direction of each of the first lower insulating layer and the sixth upper insulating layer is greater than a thickness in the vertical direction of each of the fourth lower insulating layer and the third upper insulating layer.

18. The semiconductor device as claimed in claim 17, wherein a thickness in the vertical direction of at least one of the first, second, third, fourth, and fifth lower layers is greater than the thickness in the vertical direction of each of the lower word line and the upper word line, wherein a thickness in the vertical direction of at least one of the third upper layer, the fourth upper layer, and the fifth upper layer is greater than the thickness in the vertical direction of each of the lower word line and the upper word line, and wherein a thickness in the vertical direction of each of the second lower insulating layer and the fifth upper insulating layer is greater than the thickness in the vertical direction of each of the fourth lower insulating layer and the third upper insulating layer.

19. The semiconductor device as claimed in claim 18, wherein a thickness in the vertical direction of at least one of the first uppermost layer and the second lowermost layer is greater than the thickness in the vertical direction of each of the lower word line and the upper word line.

20. A semiconductor device, comprising:

a lower stack structure, said lower stack structure comprising an alternating vertical arrangement of a plurality of lower insulating layers and a plurality of lower electrode layers, and said plurality of lower electrode layers including at least first and second lower electrode layers;

an upper stack structure on the lower stack structure, said upper stack structure comprising an alternating vertical arrangement of a plurality of upper insulating layers and a plurality of upper electrode layers, and said plurality of upper electrode layers including at least first and second upper electrode layers; and a channel structure extending at least partially through the upper stack structure and at least partially through the lower stack structure and extending in a vertical direction, which is perpendicular to an upper surface of a substrate, wherein a thickness in the vertical direction of at least one of the first lower electrode layer and the first upper electrode layer is greater than a thickness in the vertical direction of the second lower electrode layer, wherein, among the plurality of lower electrode layers, the first lower electrode layer is disposed nearest an interface between the lower stack structure and the upper stack structure;

wherein, among the plurality of upper electrode layers, the first upper electrode layer is disposed nearest the interface, and wherein a fourth one of the plurality of upper electrode layers extends between the first and second upper electrode layers and a thickness of the fourth one in the vertical direction is greater than a thickness of the second upper electrode layer in the vertical direction.

* * * * *